United States Patent
Eberl et al.

(10) Patent No.: US 6,379,459 B1
(45) Date of Patent: Apr. 30, 2002

(54) CRYSTALLIZATION OF POWDERS HAVING UNIFORM PARTICLE SIZES BY OSTWALD RIPENING AT LARGE LEVELS OF SUPERSATURATION

(75) Inventors: Dennis D. Eberl, Boulder; Daniel E. Kile, Aurora, both of CO (US); Anthony R. Hoch, Appleton, WI (US)

(73) Assignee: The United States of America as represented by the Secretary of the Interior, Washington, DC (US)

(*) Notice: Subject to any disclaimer, the term of this patent is extended or adjusted under 35 U.S.C. 154(b) by 0 days.

(21) Appl. No.: 09/694,815

(22) Filed: Oct. 24, 2000

(51) Int. Cl.[7] .............................................. C30B 7/04
(52) U.S. Cl. .................................... 117/11; 117/12
(58) Field of Search .............................. 117/11, 50, 51, 117/53

(56) References Cited

U.S. PATENT DOCUMENTS

| | | | | |
|---|---|---|---|---|
| 3,900,292 A | * | 8/1975 | Fairchild | 23/273 |
| 4,067,739 A | * | 1/1978 | Lewis | 118/19 |
| 5,239,805 A | * | 8/1993 | Saitou | 430/569 |
| 5,254,453 A | * | 10/1993 | Chang | 430/569 |
| 5,716,419 A | * | 2/1998 | Larsen | 23/300 |
| 5,807,665 A | * | 9/1998 | Saitou | 430/569 |

\* cited by examiner

Primary Examiner—Felisa Hiteshew
(74) Attorney, Agent, or Firm—Ross F. Hunt, Jr.

(57) ABSTRACT

A method is provided for the manufacture of mineral power crystals having a uniform mean size. The method includes forming a solution which is highly supersaturated with respect to the crystals. The crystals of the solution are Ostwald ripened at a level of supersaturation that produces an Ostwald steady state crystal size distribution shape wherein the crystals are of a uniform size. After Ostwald ripening ceases, the crystals further grow by supply controlled growth which uniformly increases the size thereof. This enables the supply controlled growth to be terminated at a selected, controlled point so as to produce a desired mean crystal size.

4 Claims, 1 Drawing Sheet

CRYSTALLIZATION OF POWDERS HAVING UNIFORM PARTICLE SIZES BY OSTWALD RIPENING AT LARGE LEVELS OF SUPERSATURATION

BACKGROUND OF THE INVENTION

1. Field of the Invention

The present invention relates to a method for controlling the uniformity of particle size in powder manufacturing processes. More particularly, the invention relates to a method for controlling uniformity of particle size by controlled Ostwald ripening at large levels of supersaturation.

2. Background of the Invention

Many production and industrial processes require the use of powders, either in dry form or in slurries. For example, the DuPont Chemical Company estimates that 80% of its products involve the use of either particulates, or particulate intermediaries. It is important that these powders react as well and as predictably as possible for insuring the success of processes in which they are used. Much effort has been devoted to the important problem of synthesizing particulates having uniform sizes. Powders having a small particle size variance tend to react uniformly. On the other hand, powders having a larger size variance amongst their crystals, have the tendency for smaller crystals in the system to react faster than larger crystals. The difference in reaction rates results in inferior reactions and inferior products. Additionally, uniform powders have better flow properties. These powders are less likely to plug filters with crystals from the fine part of the size distribution, or to lose product from the coarse part of the distribution by settling. The firing properties of such uniform powders are more uniform, leading to greater strength for ceramics. Optical coatings using more uniform crystals are more transparent. Abrasives with more uniform powders used in polishing compounds are superior, leading to smoother polished surfaces. In the magnetic recording industry, a uniform grain size distribution of nanocrystals used in making magnetic tapes and disks would dramatically enhance the signal to noise ratio. Many other products, including dyes, polymers and photographic films, would benefit from improved control of particle size during synthesis.

Two mechanical methods of powder manufacture are commonly used within the powder manufacturing art to control crystal size. These methods are grinding and sieving. Both of these methods can be used to control the mean size of a batch of crystals. However, these methods lead to a broad distribution of sizes amongst the individual crystals.

The prior art includes other attempts to improve the control of both particle size distribution and mean particle size within a particulate batch. Prior art patents of interest include U.S. Pat. No. 5,716,419 (Larsen), U.S. Pat. No. 5,254,453 (Chang), U.S. Pat. No. 4,067,739 (Lewis), and U.S. Pat. No. 3,900,292 (Fairchild). Briefly considering these patents, the Lewis patent discloses a method for the production of a silver halide emulsion containing crystals with a narrow size distribution. The method involves Ostwald ripening followed by a crystal growth stage and produces a monosize silver halide emulsion in which the majority of the crystals are of the twin octahedral type. The Fairchild patent discloses a process for controlling the size distribution of crystals by maintaining a fixed ratio between the rate in which the crystals are added to, and products slurry withdrawn from, a crystallizer. The Larsen patent discloses a method of producing large crystals with a narrower and more uniform size distribution involving the use of lecithin or lecithin-containing compositions in aqueous solutions containing mineral salts. The Chang patent discloses a process for the preparation of tabular silver halide grains with a narrow size distribution and a lower percentage of fine grains involving digesting nucleated grains in a basic silver halide solvent with a specific concentration. The basic solvent is neutralized when the digestion is complete.

SUMMARY OF THE INVENTION

In accordance with the invention, a method is provided for the manufacture of crystals having a uniform mean size, the method comprising the steps of: a) forming a solution which is supersaturated with respect to the crystals and Ostwald ripening the crystals in the solution at a level of supersaturation that produces an Ostwald universal steady state crystal size distribution shape wherein the crystals have approximately the same size; b) after Ostwald ripening ceases, further growing the crystals by supply controlled growth; and c) terminating the supply controlled growth at a desired mean crystal size.

Advantageously, the supply controlled growth is terminated by a reaction poisoning step, although other termination methods can be used.

In one preferred embodiment, the crystals are calcite crystals, although the invention is applicable to a great many different minerals. Advantageously, in the preferred embodiment, the level of supersaturation is such that the solution ion activity product divided by the calcite solubility product (omega) is greater than 100.

Further features and advantages of the present invention will be set forth in, or apparent from, the detailed description of preferred embodiments thereof which follows.

DESCRIPTION OF THE REFERRED EMBODIMENTS

One component of the invention concerns the creation of crystal size distributions having a uniform size, i.e., having a small logarithmic-based variance or $\beta^2$, by Ostwald ripening. Although, as set forth hereinbelow, the method is broadly applicable, in a specific example discussed hereinafter, Ostwald ripening occurred during the rapid mixing of $NaCO_3$ and $CaCl_2$ solutions to form a solution that was highly supersaturated with respect to calcite. During the Ostwald ripening process, finer crystals dissolve within the solution because they have a larger specific surface area to react with the solution than do coarser crystals. This makes the finer crystals less stable. Matter is transferred from the dissolving fine crystals through solution to the coarser crystals which then grow larger. As ripening proceeds, the shape of the crystal size distribution, regardless of its original shape, approaches that of a universal steady state shape for diffusion controlled Ostwald ripening. This crystal size distribution shape has a very narrow size variance as well as a cutoff at large sizes. This makes the crystal size distribution ideal for many applications. One aspect of the invention concerns the discovery that the universal steady-state crystal size distribution curve for diffusion controlled Ostwald ripening can occur at large levels of supersaturation. This curve is shown in the solid line that skews to the left in FIG. 2 and for a further discussion thereof and of the basic (LSW) theory here, reference is made to Lifshitz, I. M. and Slyozov, V. V., "The Kinetics of Precipitation form Supersaturated Solid Solutions," Journal of Physics and Chemistry of Solids; V. 19, p. 35–50 (1961) and Wagner, C., "Theorie der Alterung von Neiderschlägen durch Umlösen (Ostwald Reifung)"; Zeitschrift fuer Electrochemie; v. 65, p 581–581 (1961). When this crystal size distribution curve is produced, all of the crystals have approximately the same size.

A second important component of the invention concerns the preservation of the shape of the ripened crystals (which have a size in the nanometer range) by supply-controlled growth as the main crystal size increases. (Reference is made to Eberl, D. D., Drits, V. A., and Srodon, J., "Deducing Growth Mechanisms for Minerals from the Shapes of Crystal Size Distributions", American Journal of Science, 298, 499–533 (1998).) This use of supply controlled growth enables the reaction to be switched off to realize any mean crystal size with a narrow size distribution. This switching off of the process can be achieved by poisoning the reaction or other known techniques.

Figure 1:
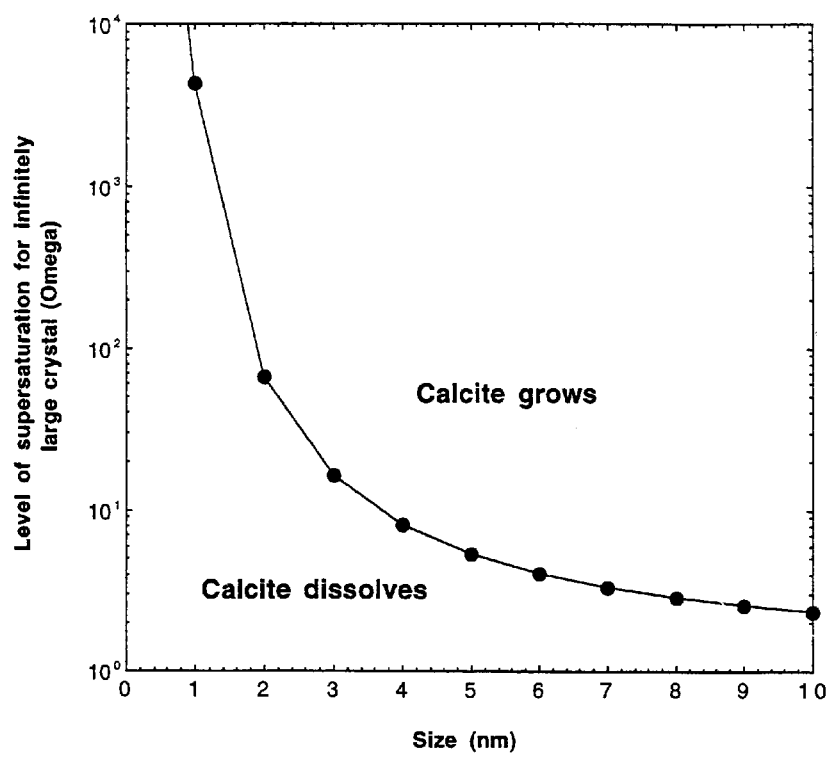
FIG. 1 is a graph which is used in explanation of the invention and in which the solubility of calcite is plotted as a function of particle size.

Turning to FIG. 1, a plot is provided of particle solubility as a function of particle size and in particular, the level of supersaturation for an infinitely large crystal (omega) versus size in nanometers. As indicated above, one aspect of the invention concerns the discovery that ripening is not limited to small levels of supersaturation but can occur at large supersaturations, immediately after nucleation. FIG. 1 indicates that particle solubility increase exponentially at very small particle sizes. Particles formed at large levels of supersaturation tend to be smaller than those formed at lower levels of saturation. The crystals are said to have a small critical nucleus. FIG. 1 shows that these small crystals, ranging in calcite particle size from about 1 to 4 nanometers, are very sensitive to small decreases in supersaturation levels caused by crystal growth. Therefore, these small crystals will dissolve after formation, leading to an Ostwald ripening process.

The Ostwald ripening ceases when the specific surface area does not greatly differ among the crystals. As indicated above, a further key aspect of the invention is that after Ostwald ripening ceases, a second crystal growth mechanism begins, viz., a supply controlled growth. During the second crystal growth mechanism, the relative shape of the crystal size distribution is maintained ($\beta^2$=constant) as the mean crystal size is increased. As a consequence of this approach, as supply controlled growth proceeds, the crystal growth process can be interrupted at any time. As indicated above, the growth process can be interrupted by poisoning the reaction or using other known techniques. Thus, controlled interruption of the process can be used to provide a very narrow particle size distribution having a predictable shape (which is predicted by the corresponding LSW theory and shown in FIG. 2) and a desired mean particle size. Thus, according to the invention, uniform size distribution is established by using Ostwald ripening and the shape of this distribution is retained during supply-controlled growth to obtain the shape for any mean particle size.

Although the example mentioned above, and described in more detail below, relates to calcite it will be appreciated that the process of the invention can be used with a great many types of minerals. Such minerals would thus initially form the Ostwald crystal size distribution at large levels of supersaturation and then maintain this distribution shape during subsequent supply-controlled growth. It is also possible to have a similar process occur during vapor deposition.

It will be appreciated that the method of the invention is simpler than the sieving or grinding processes of the prior art and produces a crystal size distribution having a very small size variance and a constant shape, no matter the mean size.

Figure 2:
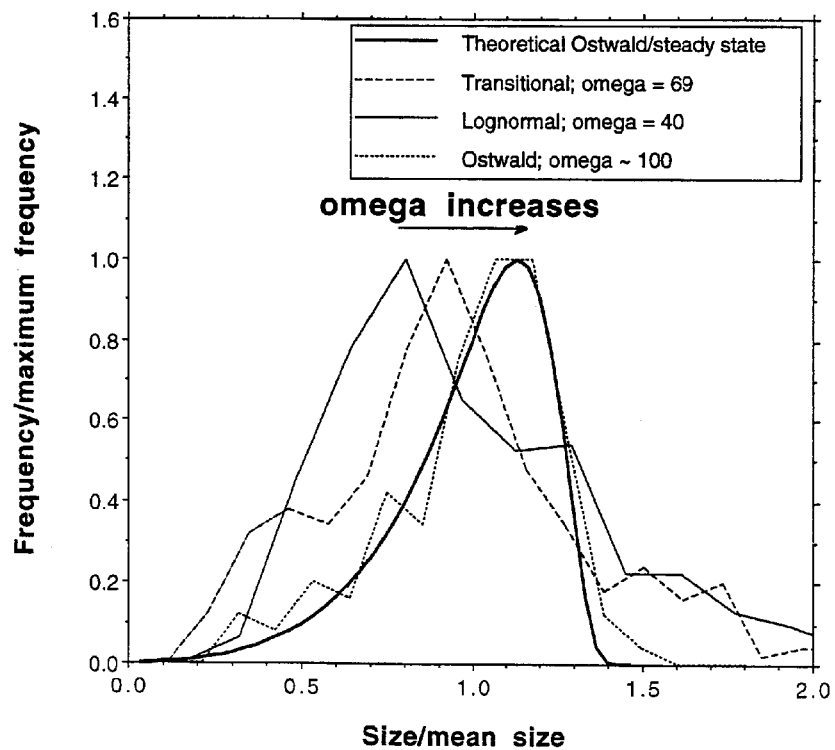
FIG. 2 is a further graph which is used in explanation of the invention and in which crystal size distribution is plotted for different values of omega.

EXAMPLE $NaCO_3$ and $CaC_2$ solutions were rapidly mixed to form a solution highly supersaturated with respect to calcite. Calcite crystals were grown under varying conditions of supersaturation. It was found that universal steady state crystal size distribution could be produced for diffusion-controlled Ostwald ripening at large levels of supersaturation. When this crystal size distribution shape was produced, all of the crystals had approximately the same size. As shown in FIG. 2, an initial omega of 100 or above (wherein, as indicated above, omega is the degree of supersaturation defined as the solution ion activity product divided by the calcite solubility product) produced an Ostwald crystal size distribution curve. As shown in FIG. 2, the Ostwald distribution is narrower than the others shown and has a cutoff at larger sizes. In this regard, as illustrated, an omega of 40 or less produced lognormally shaped crystal size distributions. Intermediate omegas (an example of omega=69 is shown in FIG. 2) produced crystal size type distribution shapes that were transitional between the Ostwald and the lognormal shapes.

Although the invention has been described above in relation to a preferred embodiment thereof, it will be readily understood by those skilled in the art that variations and modifications can be effected without departing from the scope and spirit of the invention.

What is claimed is:

1. A method for the manufacture of crystals having a uniform size, said method comprising the steps of:

a) forming a solution which is supersaturated with respect to the crystals and Ostwald ripening the crystals at levels of supersaturation that produce an Ostwald universal steady state crystal size distribution shape wherein the crystals therein have approximately the same size;

b) after Ostwald ripening ceases, further growing the crystals by supply control growth; and c) terminating the supply controlled growth at a desired mean crystal size.

2. A method according to claim 1, wherein the supply controlled growth is stopped by poisoning.

3. A method according to claim 1, wherein the crystals are calcite crystals.

4. A method according to claim 3, wherein the level of supersaturation is such that solution ion activity product divided by the calcite solubility product is greater than 100.

* * * * *

UNITED STATES PATENT AND TRADEMARK OFFICE
CERTIFICATE OF CORRECTION

PATENT NO.   : 6,379,459 B1                                                          Page 1 of 1
DATED        : April 30, 2002
INVENTOR(S)  : Eberl, Kile and Hoch It is certified that error appears in the above-identified patent and that said Letters Patent is hereby corrected as shown below:

<u>Column 4,</u>
Line 16, please insert the letter -- l -- between the second capital "C" and the small "2"

Signed and Sealed this

Tenth Day of September, 2002

Attest:

JAMES E. ROGAN
Attesting Officer      Director of the United States Patent and Trademark Office